(12) United States Patent
Gyoten

(10) Patent No.: US 10,756,730 B2
(45) Date of Patent: Aug. 25, 2020

(54) SEMICONDUCTOR LIGHT-EMITTING DEVICE DRIVING APPARATUS CONTROLLING OUTPUT LIGHT FROM LIGHT-EMITTING DEVICE IN ACCORDANCE TO PWM MODULATION SIGNAL

(71) Applicant: Panasonic Intellectual Property Management Co., Ltd., Osaka (JP)

(72) Inventor: Takaaki Gyoten, Hyogo (JP)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 0 days.

(21) Appl. No.: 16/553,502

(22) Filed: Aug. 28, 2019

(65) Prior Publication Data

US 2020/0076423 A1 Mar. 5, 2020

(30) Foreign Application Priority Data

Aug. 29, 2018 (JP) .................. 2018-160646

(51) Int. Cl.
*H03K 17/687* (2006.01)
*H03K 7/08* (2006.01)
*H05B 45/10* (2020.01)
*H05B 45/37* (2020.01)
*H05B 45/345* (2020.01)

(52) U.S. Cl.
CPC ............. *H03K 17/687* (2013.01); *H03K 7/08* (2013.01); *H05B 45/10* (2020.01); *H05B 45/345* (2020.01); *H05B 45/37* (2020.01)

(58) Field of Classification Search
CPC ........ H05B 33/08; H05B 45/37; H05B 45/10; H03K 7/08; H03K 17/687
See application file for complete search history.

(56) References Cited

U.S. PATENT DOCUMENTS

2004/0124889 A1   7/2004  Koharagi et al.
2016/0353533 A1* 12/2016  Gyoten ................. H05B 45/37

FOREIGN PATENT DOCUMENTS

| JP | 2004-147435 | 5/2004 |
| JP | 2008-130968 | 6/2008 |
| JP | 2014-230296 | 12/2014 |

* cited by examiner

*Primary Examiner* — John W Poos
(74) *Attorney, Agent, or Firm* — Wenderoth, Lind & Ponack, L.L.P.

(57) ABSTRACT

A semiconductor light-emitting device driving apparatus is disclosed with a semiconductor light-emitting device. In the semiconductor light-emitting device driving apparatus, a switching power supply outputs a driving current for driving the semiconductor light-emitting device, and a switching element controls the driving current to be turned on and off. A PWM modulator generates a PWM modulation signal for controlling the switching element to be turned on and off based on a PWM setting value inputted from outside, and a feedback circuit drives and controls the switching power supply based on the driving current and a target current value that is externally inputted. The feedback circuit drives and controls the switching power supply such that an average value of the driving current for an interval when the driving current flows is equal to the target current value.

4 Claims, 8 Drawing Sheets

SEMICONDUCTOR LIGHT-EMITTING DEVICE DRIVING APPARATUS CONTROLLING OUTPUT LIGHT FROM LIGHT-EMITTING DEVICE IN ACCORDANCE TO PWM MODULATION SIGNAL

BACKGROUND OF THE INVENTION

1. Field of the Invention

The present disclosure relates to a semiconductor light-emitting device driving apparatus for controlling output light of a semiconductor light-emitting device in accordance with a PWM modulation signal (Pulse Width Modulation signal).

2. Description of Related Art

Patent Document 1 discloses a light-emitting device driving apparatus that outputs a pulse current with a constant level upon suppressing influence of changes in a temperature or a power supply voltage in elements, variation of element characteristics, and the like. The light-emitting device driving apparatus includes a power supply, a semiconductor light-emitting device, an FET, and a detection resistor connected in series. By controlling the FET to be turned on and off in accordance with a switching signal from outside, a current flowing in the semiconductor light-emitting device is subjected to PWM modulation to adjust the luminance. At the same time, the capacitor is charged with a difference voltage between a voltage of the detection resistor when the switching signal is turned on and a reference voltage. Further, by controlling a power supply voltage in accordance with the output voltage of the capacitor, a peak value of the flowing current is kept constant. This allows to output a pulse current with a constant level upon suppressing influences of changes in the temperature of the devices mid changes in the power supply voltage, variation of the device characteristics, and the like.

In this case, this semiconductor light-emitting device driving apparatus time-averages the value of the current flowing in the semiconductor light-emitting device, and compares an averaged value with a target current value to drive and control the power supply with feedback. However, when the duty cycle of the PWM modulation is small, for example, such as less than 5%, the value of the current flowing in the semiconductor light-emitting device is zero in most of a cycle of the PWM modulation, and the average current value is also to be very small. Therefore, such a problem occurs that it is not possible to perform accurate feedback under large influence of changes in the temperature of the semiconductor light-emitting device, variation of device characteristics, and the like, and then, the driving current, to be supplied becomes unstable.

PRIOR ART DOCUMENT

Patent Document

Patent Document 1: Japanese Patent Laid-open Publication No. JP2004-147435A

SUMMARY OF THE INVENTION

The present disclosure provides a semiconductor light-emitting device driving apparatus capable of supplying a stable driving current even when the duty cycle of PWM modulation is small, for example, such as less than 5%.

According to one aspect of the present disclosure, there is provided a semiconductor light-emitting device driving apparatus including a semiconductor light-emitting device. The semiconductor light emitting device driving apparatus includes a switching power supply, a switching element, a PWM modulator, and a feedback circuit. The switching power supply outputs a driving current for driving the semiconductor light-emitting device, and the switching element that controls the driving current to be turned on and off. The PWM modulator that generates a PWM modulation signal for controlling the switching element to be turned on and off based on a PWM setting value inputted from outside, and the feedback circuit that drives and controls the switching power supply based on the driving current and a target current value that is externally inputted. The feedback circuit drives and controls the switching power supply such that an average value of the driving current for an interval when the driving current flows is equal to the target current value.

According to a semiconductor light-emitting device driving apparatus according to the present disclosure, it is possible to supply a stable driving current to a semiconductor light-emitting device even when a duty cycle of PWM modulation is small, for example, such as less than 5%.

EMBODIMENTS

Hereinafter, embodiments will be described in detail with reference to the drawings as needed. However, explanation more detailed than necessary may be omitted. For example, detailed descriptions of well-known matters and redundant explanations for substantially the same configuration may be omitted. This is to avoid unnecessary redundancy of the following description and to facilitate understanding by those skilled in the art.

It is to be noted that the inventor provides the accompanying drawings and the following description in order to enable those skilled in the art to fully understand the present disclosure, and does not intend to limit the claimed subject matter by them.

First Embodiment

Hereinafter, a first embodiment will be described with reference to FIGS. 1 and 2.

1-1. Configuration

Figure 1:
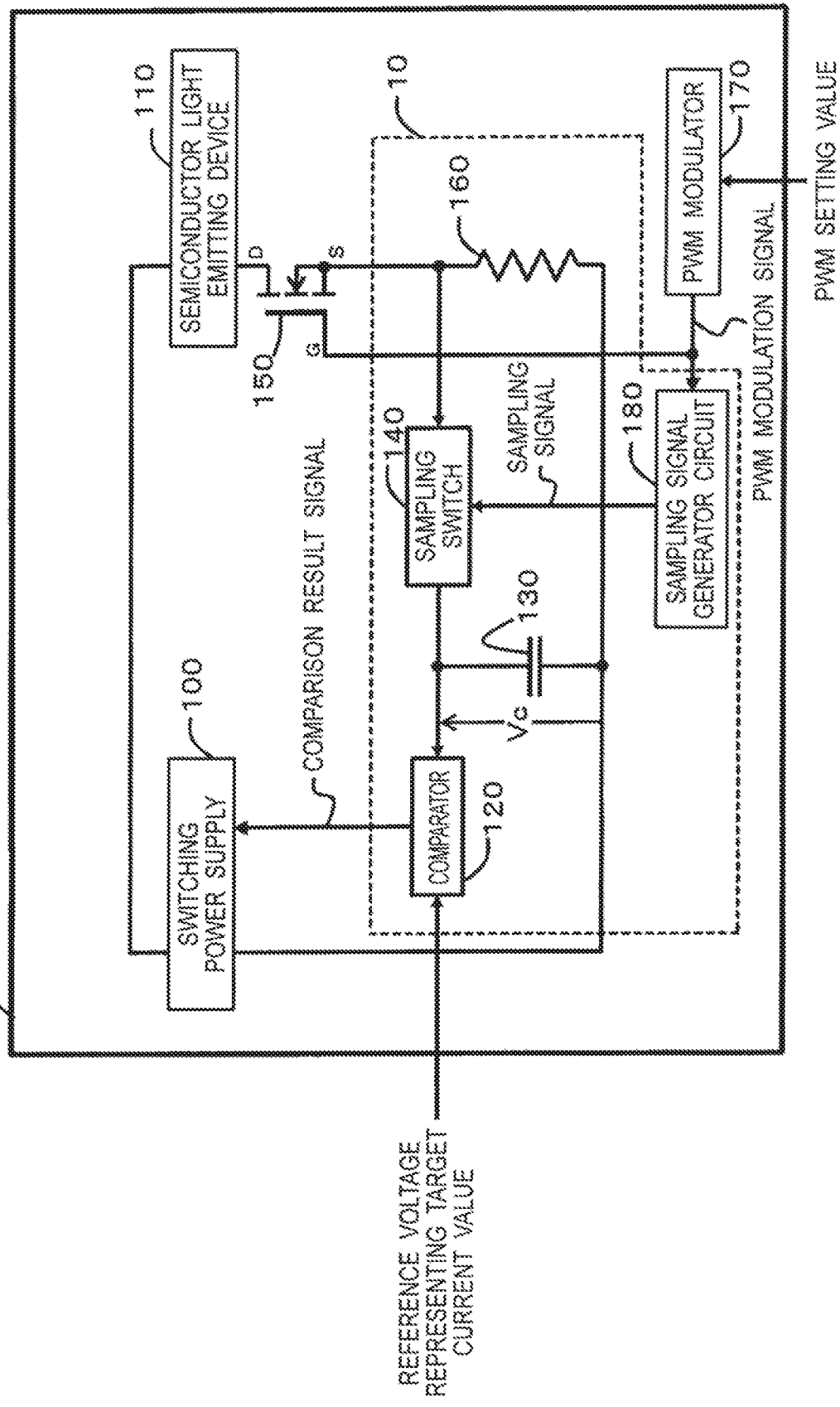
FIG. 1 is a block diagram showing a configuration example of a semiconductor light-emitting device driving apparatus 1 according to a first embodiment.

FIG. 1 is a block diagram showing a configuration example of a semiconductor light-emitting device driving apparatus 1 according to the first embodiment. Referring to FIG. 2, the semiconductor light-emitting device driving apparatus 1 includes a switching power supply 100, a semiconductor light-emitting device 110, a feedback circuit 10, an FET 150, and a PWM modulator 170. The feedback circuit 10 includes a comparator 120, a capacitor 130, a sampling switch 140, a detection resistor 160, and a sampling signal generator circuit 180. The switching power supply 100, the semiconductor light-emitting device 110, the FET 150, and the detection resistor 160 are connected in series in this order.

The switching power supply 100 generates a driving current flowing in the semiconductor light-emitting device 110. The semiconductor light-emitting device 110 is driven by a driving current from the switching power supply 100, to emit light. The PWM modulator 170 generates a PWM modulation signal in accordance with a PWM setting value (instruction value of duty cycle) inputted from an external circuit, and outputs lire PWM modulation signal to the FET 150 and the sampling signal generator circuit 180. The FET 150 is a switching element configured to include, for example, an N-channel MOSFET, and switches over turning on and off in accordance with the PWM modulation signal, to control die driving current flowing in the semiconductor light-emitting device 110 to be turned on and off.

The sampling signal generator circuit 180 generates a sampling signal on the basis of the inputted PWM modulation signal, and outputs the sampling signal to the sampling switch 140. The sampling signal is generated by delaying the PWM modulation signal by a predetermined time to be turned on only during the interval when the driving current actually flows. The sampling switch 140 switches over turning on and off in accordance with the sampling signal.

The detection resistor 160 generates a detection voltage by a driving current. The capacitor 130 averages the detection voltage only during the interval when the sampling switch 140 is turned on to set the averaged detection voltage as an output voltage Vc, and outputs the output voltage Vc to the comparator 120. The comparator 120 compares a reference voltage indicating a target current value inputted from outside with the output voltage Vc of the capacitor 130, and generates a comparison result signal indicating the difference, to drive and control the switching power supply 100.

1-2. Operation

The operation of the semiconductor light-emitting device driving apparatus 1 configured as described above will be described in detail below.

Referring to FIG. 1, the PWM modulator 170 generates a PWM modulation signal in accordance with a PWM setting value inputted from an external circuit such that a duty cycle value of the PWM modulation signal matches the PWM setting value, and outputs the PWM modulation signal to the FET 150 and the sampling signal generator circuit 180.

The FET 150 switches over turning on and off the conduction thereof in accordance with the PWM modulation signal from the PWM modulator 170, to control the driving current to be turned on and off. In this case, the driving current actually flowing in the semiconductor light-emitting device 110 has delay times at the on and off timings as compared with the PWM modulation signal. These are due to delays in on and off switchings of the FET 150, the inductance of wirings, and the like. Hereinafter, the configuration and operation for taking the measures against the delays will be described.

Figure 2:
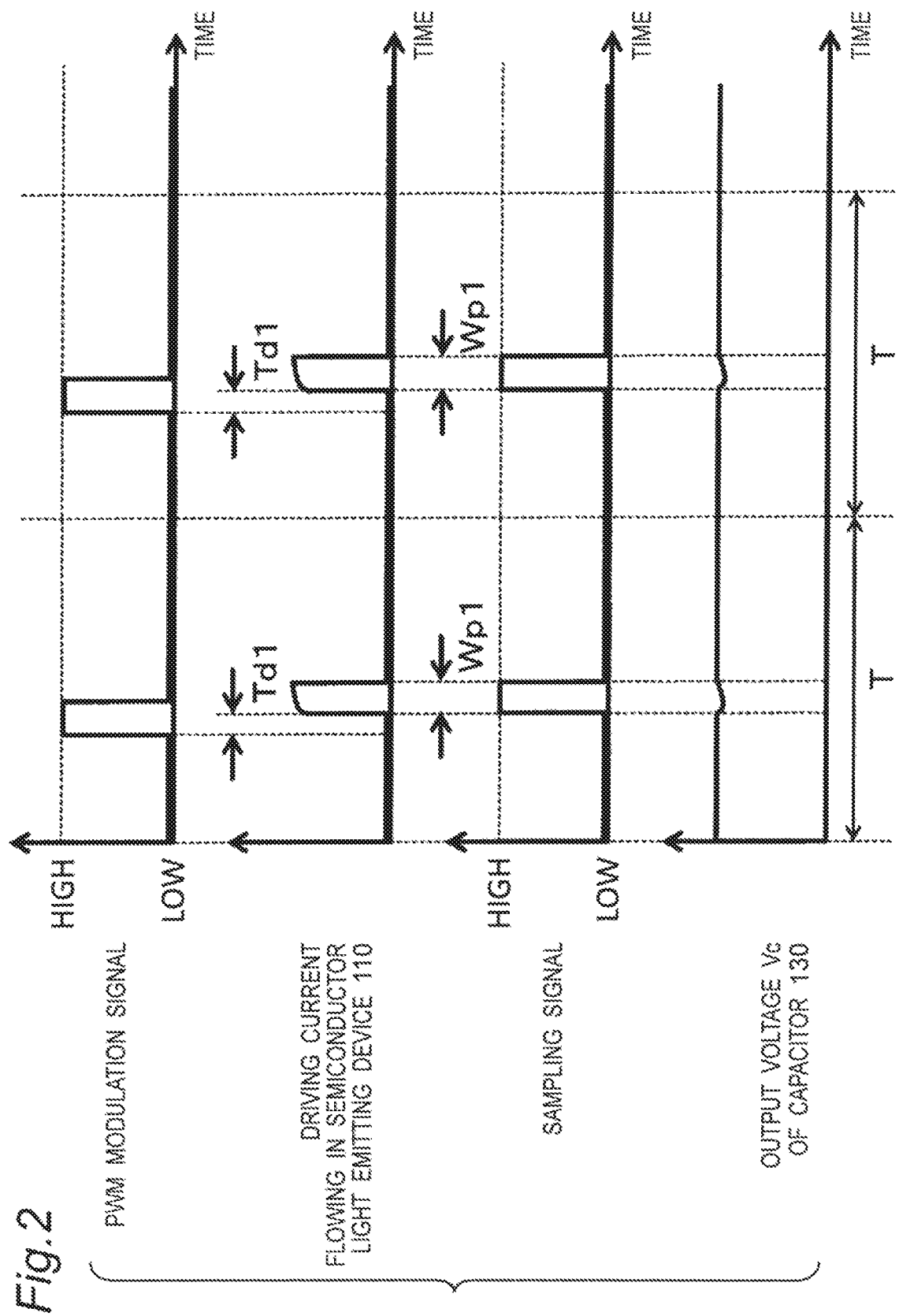
FIG. 2 is a timing chart showing an example of changes in signals etc. in the semiconductor light-emitting device driving apparatus 1 of FIG. 1.

FIG. 2 is a timing chart showing an example of changes in the signals etc. in the semiconductor light-emitting device driving apparatus 1 of FIG. 1. In FIG. 2, T denotes a cycle of the PWM modulation signal. Td1 denotes a delay time in the sampling signal generator circuit. Wp1 denotes the pulse width of the sampling signal.

Referring to FIG. 2, the delay time Td1 occurs in the driving current with respect to the PWM modulation signal. The sampling signal generator circuit 180 delays the PWM modulation signal inputted from the PWM modulator 170 by the time Td1 to set the delayed PWM modulation signal as the sampling signal, and outputs the sampling signal to the sampling switch 140. This allows the sampling signal to be turned on only during the interval when the current actually flows in the semiconductor light-emitting device 110.

The sampling switch 140 is controlled to be turned on and off by the sampling signal. The detection voltage generated by the detection resistor 160 charges the capacitor 130, only when the sampling signal is turned on. When the sampling signal is turned off, the charge in the capacitor 130 is stored. Therefore, the output voltage Vc of the capacitor 130 becomes the voltage value obtained by time-averaging the detection voltage, which is generated by the detection resistor 160 due to the driving current when the driving current actually flows.

It is noted that, in the present embodiment, the delay time Td1 in the sampling signal generator circuit has been set in advance in accordance with the characteristics of the devices and elements and the like, configuring the semiconductor light-emitting device driving apparatus 1. However, the semiconductor light-emitting device driving apparatus 1 may further include a delay measurement unit, and the value of the delay time Td1 of the sampling signal generator circuit may be changed at each moment.

The comparator 120 drives and controls the switching power supply 100 by comparing a reference voltage indicating a target current value inputted from outside with the output voltage Vc of the capacitor 130, and generating a comparison result signal indicating the difference and outputting the same signal to switching power supply 100. This allows the switching power supply 100 to be driven and controlled such that the average value of the driving current for the interval when the driving current actually flowing is equal to the target current value.

In the present embodiment, the output voltage Vc of the capacitor 130 is determined regardless of the PWM setting value, and the value is controlled to be equal to the reference voltage indicating the target current value. Therefore, even when the PWM setting value is a small value, for example, such as less than 5%, the output voltage Vc of the capacitor 130 is maintained to be a high level. This makes it possible to perform accurate feedback by suppressing influence of variation and the like of characteristics of the devices and elements configuring the semiconductor light-emitting device driving apparatus 1, and to supply a stable driving current to the semiconductor light-emitting device 110.

1-3. Advantageous Effects and Others

As described above, the semiconductor light-emitting device driving apparatus 1 according to the present embodiment is configured to include the switching power supply 100, the semiconductor light-emitting device 110, the feedback circuit 10, the FET 150, and the PWM modulator 170. The feedback circuit 10 includes the comparator 120, the capacitor 130, the sampling switch 140, the detection resistor 160, and the sampling signal generator circuit 180.

The FET 150 is controlled by the PWM modulation signal, and a detection voltage of the detection resistor 160 is averaged only when the driving current actually flows in the semiconductor light-emitting device 110. Thereafter, the averaged detection voltage is compared with a reference voltage by the comparator 120, and the switching power supply 100 is driven and controlled. As a result, even when a duty cycle of PWM modulation is small, for example, such as less than 5%, it is possible to perform accurate feedback by suppressing the influences of variation and the like of characteristics of the devices and elements configuring the semiconductor light-emitting device driving apparatus 1. Then, this leads to supplying a stable driving current in the semiconductor light-emitting device 110.

Second Embodiment

Hereinafter, a second embodiment will be described with reference to FIGS. 3 to 5.

Figure 3:
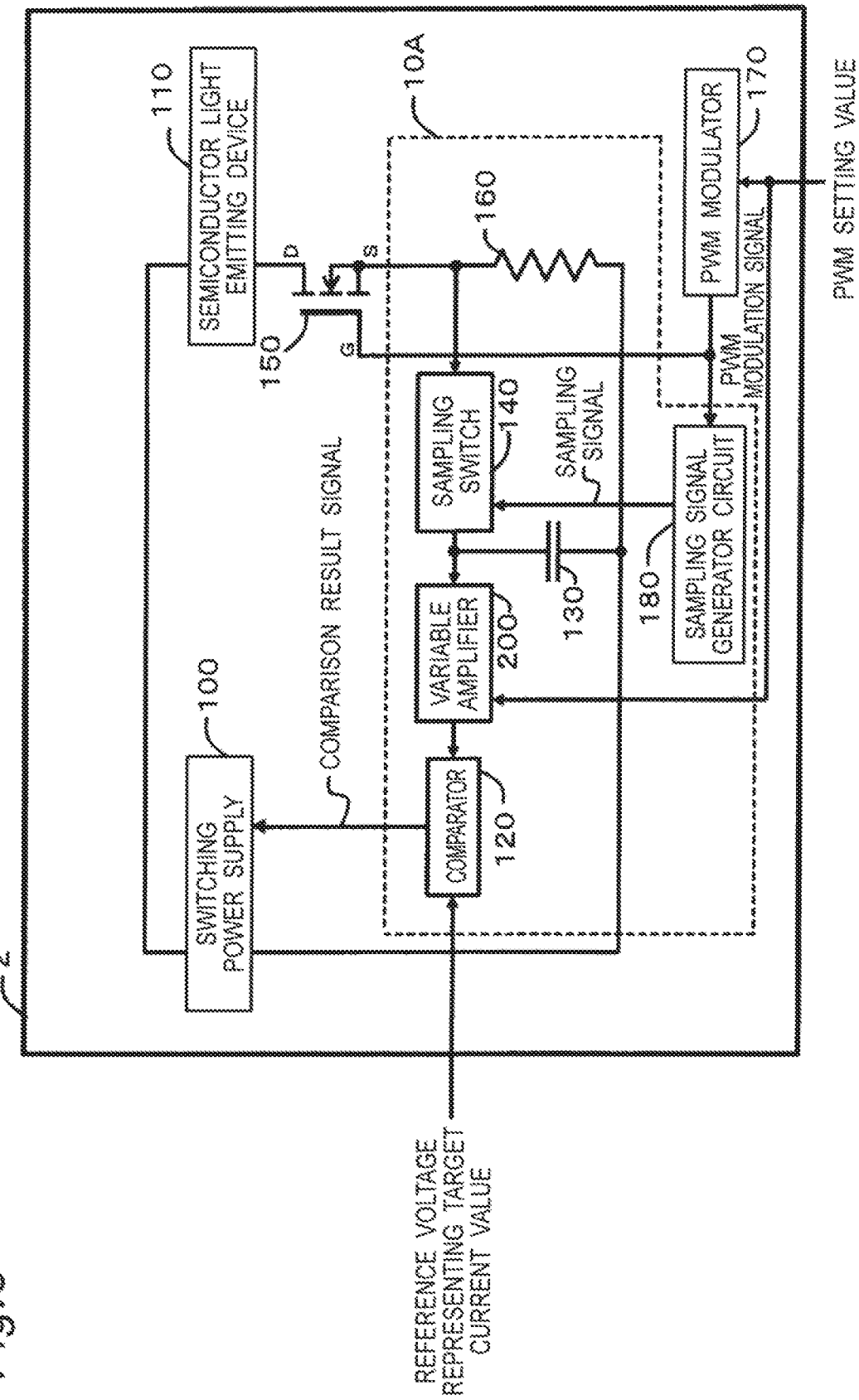
FIG. 3 is a block diagram showing a configuration example of a semiconductor light-emitting device driving apparatus 2 according to a second embodiment.

FIG. 3 is a block diagram showing a configuration example of a semiconductor light-emitting device driving apparatus 2 according to the second embodiment. The semiconductor light-emitting device driving apparatus 2 is obtained by replacing the feedback circuit 10 of the semiconductor light-emitting device driving apparatus 1 of FIG. 1 with a feedback circuit 10A. As compared with the feedback circuit 10, the feedback circuit 10A further includes a variable amplifier 200. The externally inputted PWM setting value is also inputted to the variable amplifier 200 in addition to the PWM modulator 170. The variable amplifier 200 amplifies the output voltage Vc of the capacitor 130 on the basis of the inputted PWM setting value, and outputs the output voltage Vc to the comparator 120.

In the semiconductor light-emitting device driving apparatus 2 of FIG. 3, a rising speed of a driving current at the moment when the driving current starts to flow to a semiconductor light-emitting device 110 may change depending on characteristics or a temperature and the like of devices and elements configuring the semiconductor light-emitting device driving apparatus 2. When rise of the driving current is fast enough or the duty cycle value is large enough, the driving current is saturated for the interval when the PWM modulation signal is turned ON, and the waveform thereof becomes close to rectangular. However, when the rise of the driving current is slow and the duty cycle value of the PWM modulation signal is very small, the PWM modulation signal may become off before the driving current saturates. In this case, the waveform of the driving current becomes close to a saw-tooth wave.

When the driving current has a waveform close to a saw-tooth wave, an average value thereof is smaller than that in the case of having a waveform close to rectangular. Accordingly, the output voltage Vc of the capacitor 130 decreases, and the comparator 120 drives the switching power supply 100 so as to increase the output voltage. As a result, the maximum value of the driving current increases.

Figure 4:
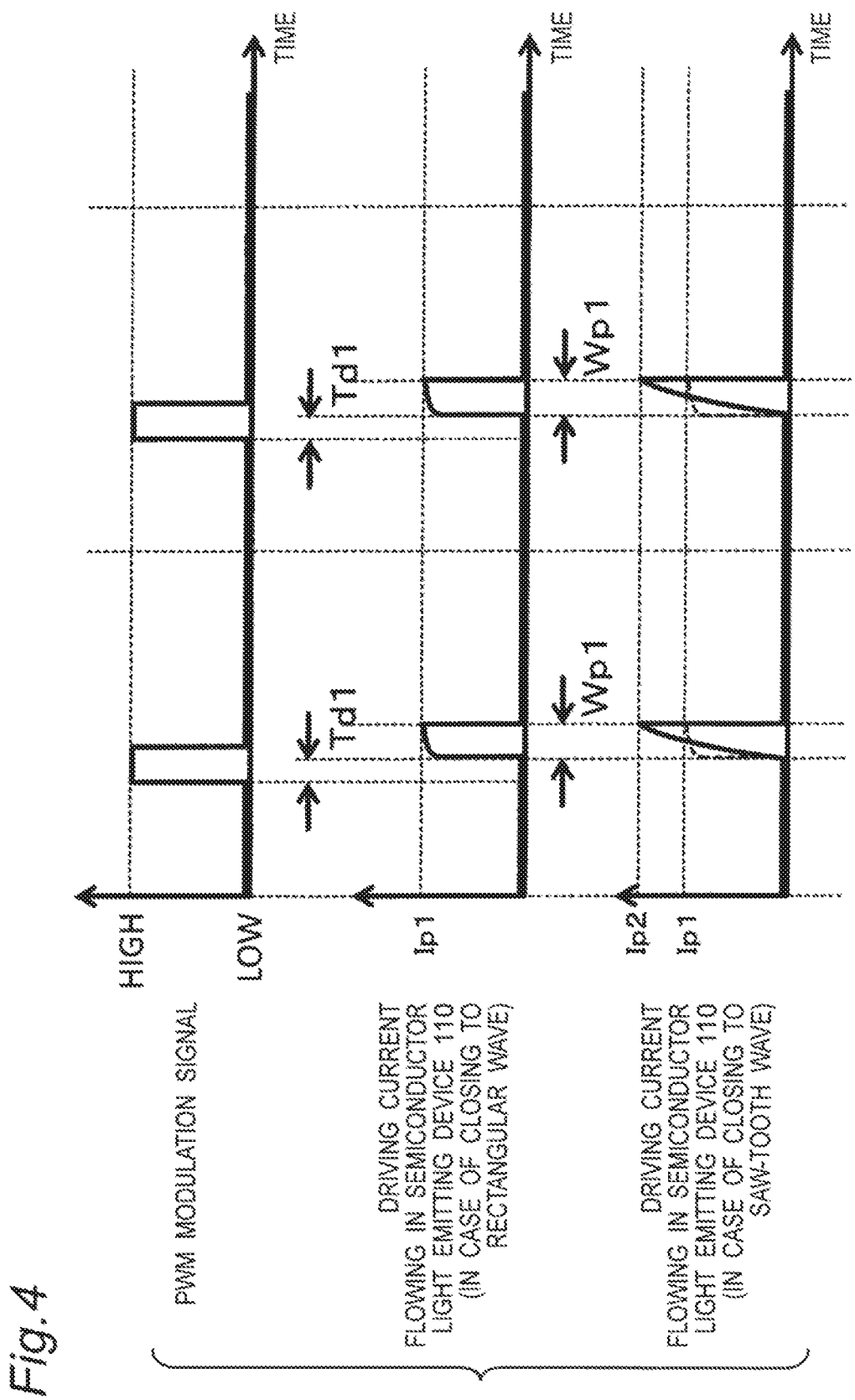
FIG. 4 is a timing chart showing an example of changes in signals etc. in the semiconductor light-emitting device driving apparatus 2 of FIG. 3.

FIG. 4 is a timing chart showing an example of changes in the signals etc. in the semiconductor light-emitting device driving apparatus 2 shown in FIG. 3. The delay time of the signal in the sampling signal generator circuit is indicated by Td1. The maximum value of rite current is indicated by Ip1 when the driving current flowing in the semiconductor light-emitting device 110 has a waveform close to a rectangular wave. The maximum value of a driving current is shown by Ip2, the driving current having increased as described above by having a waveform close to a saw-tooth wave.

In the example of FIG. 4, lowering the PWM setting value allows the maximum value of the driving current to be increased up to Ip2. When this maximum value Ip2 is larger than the maximum rated current of the semiconductor light-emitting device 110, the semiconductor light-emitting device 110 may be damaged. Therefore, in the semiconductor light-emitting device driving apparatus 2 according to the second embodiment, the variable amplifier 200 is used which amplifies the output voltage Vc of the capacitor 130 when the PWM setting value is smaller than a predetermined value.

The comparator 120 compares a voltage amplified by the variable amplifier 200 when the PWM setting value is smaller than a predetermined value described later, with an externally inputted reference voltage. Therefore, the output voltage of the switching power supply 100 is smaller than that in the case of without the variable amplifier 200. Therefore, by adjusting an amplification factor of the variable amplifier 200, the maximum value of the driving current can be made to be constant regardless of the PWM setting value. This eliminates such a problem that the driving current flowing in the semiconductor light-emitting device 110 exceeds the maximum rated current of the semiconductor light-emitting device 110 when the PWM setting value is a small value, for example, such as less than 5%.

Figure 5:
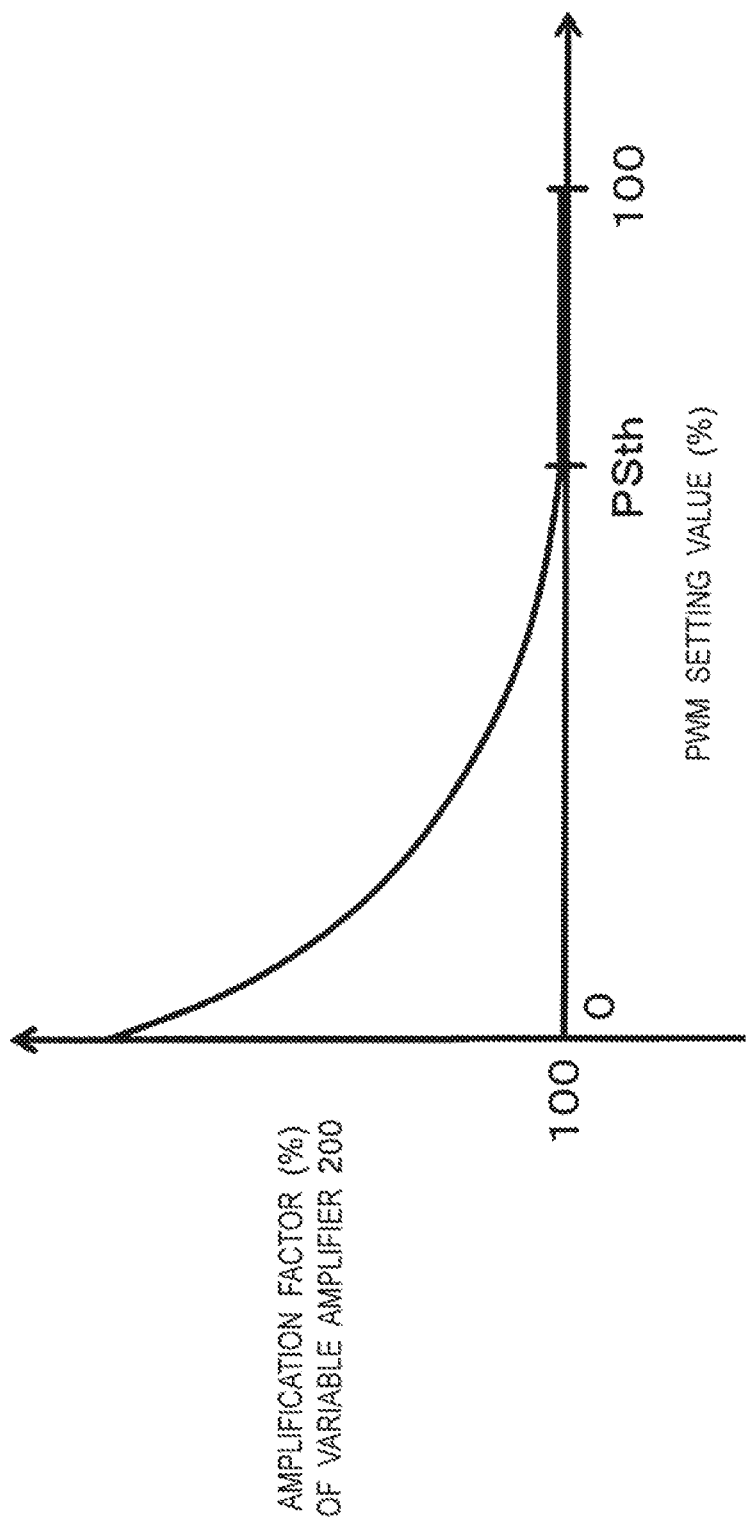
FIG. 5 is a graph showing an example of a relationship between a PWM setting value and an amplification factor of a variable amplifier 200 of FIG. 3.

FIG. 5 is a graph showing an example of a relationship between the PWM setting value and the amplification factor of the variable amplifier 200. As the PWM setting value decreases, the driving current flowing in the semiconductor light-emitting device 110 has a waveform closer to a saw-tooth wave, and the average value decreases. Therefore, in order to make the maximum value of the current flowing in the light-emitting device 110 constant regardless of the PWM setting value, the amplification factor of the variable amplifier 200 is set to increase as the inputted PWM setting value decreases.

In FIG. 5, PSth denotes a PWM setting value where the maximum value Ip2 of the driving current is exactly the same as the maximum rated current of the semiconductor light-emitting device 110. When the PWM setting value is PSth or more, the current flowing in the semiconductor fight-emitting device 110 does not exceed the maximum rated current even without using the variable amplifier 200. Therefore, the amplification factor of the variable amplifier 200 in a section where the PWM setting value is PSth or more is set to 100% (not amplified).

Third Embodiment

Hereinafter, a third embodiment will be described with reference to FIGS. 6 and 7.

Figure 6:
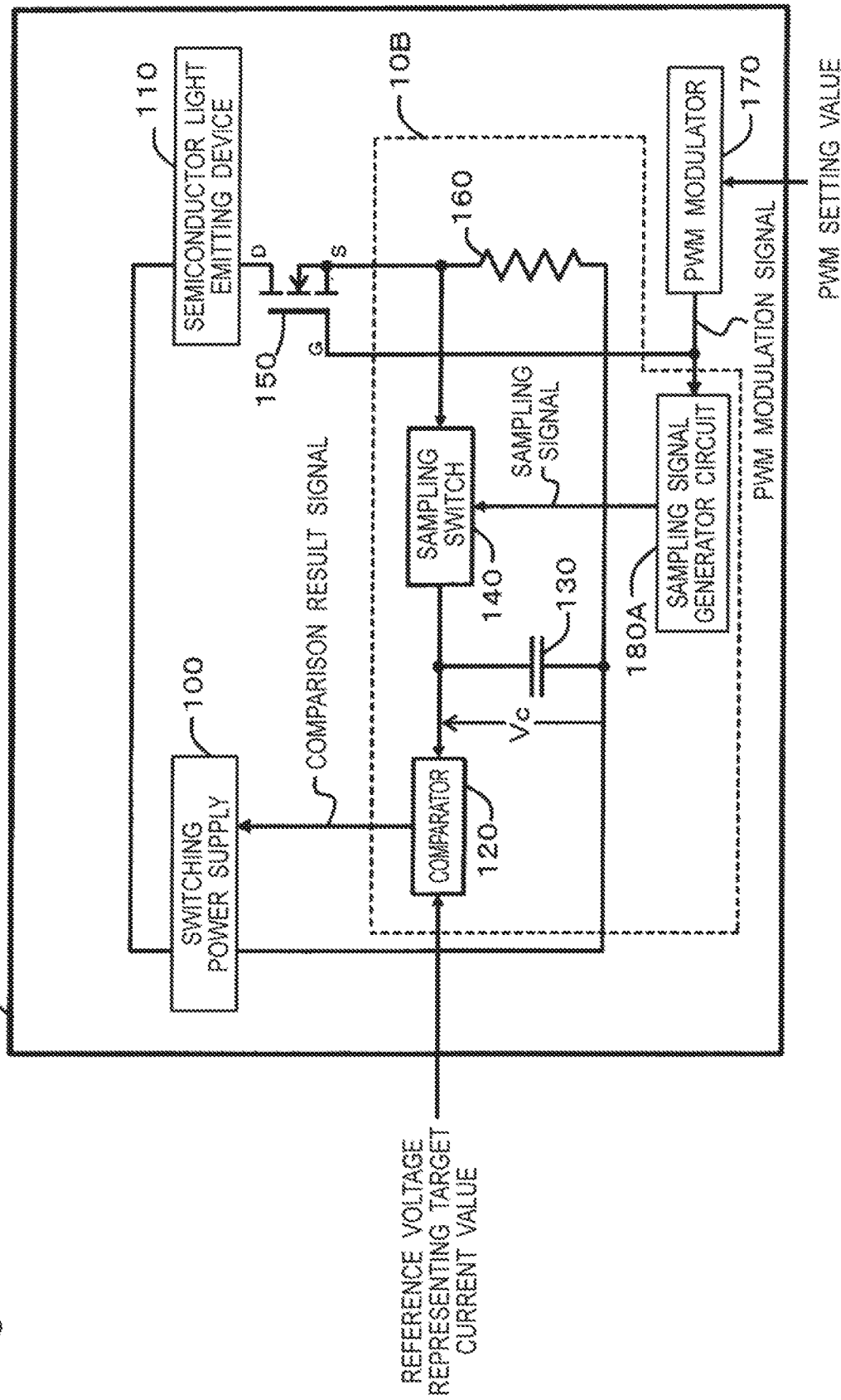
FIG. 6 is a block diagram showing a configuration example of a semiconductor light-emitting device driving apparatus 3 according to a third embodiment.

FIG. 6 is a block diagram showing a configuration example of a semiconductor light-emitting device driving apparatus 3 according to the third embodiment. As compared with the semiconductor light-emitting device driving apparatus 1 of FIG. 1, in the semiconductor light-emitting device driving apparatus 3 of FIG. 6, the feedback circuit 10 is replaced with a feedback circuit 10B. The feedback circuit 10B is provided by replacing the sampling signal generator circuit 180 of the feedback circuit 10 with the sampling signal generator circuit 180A.

In the first embodiment, the pulse width Wp1 of the sampling signal that the sampling signal generator circuit 180 generates is the same value as the pulse width of the PWM modulation signal. However, when timing or a width of a current flowing in the semiconductor light-emitting device 110 changes due to changes in the characteristics and the like of the devices and elements configuring the semiconductor light-emitting device driving apparatus 1, the detection voltage is sampled during the interval when the driving current does not flows. Then, this leads to lack accuracy in the feedback. Therefore, the sampling signal generator circuit 180A also adjusts the pulse width of the sampling signal to be generated.

Figure 7:
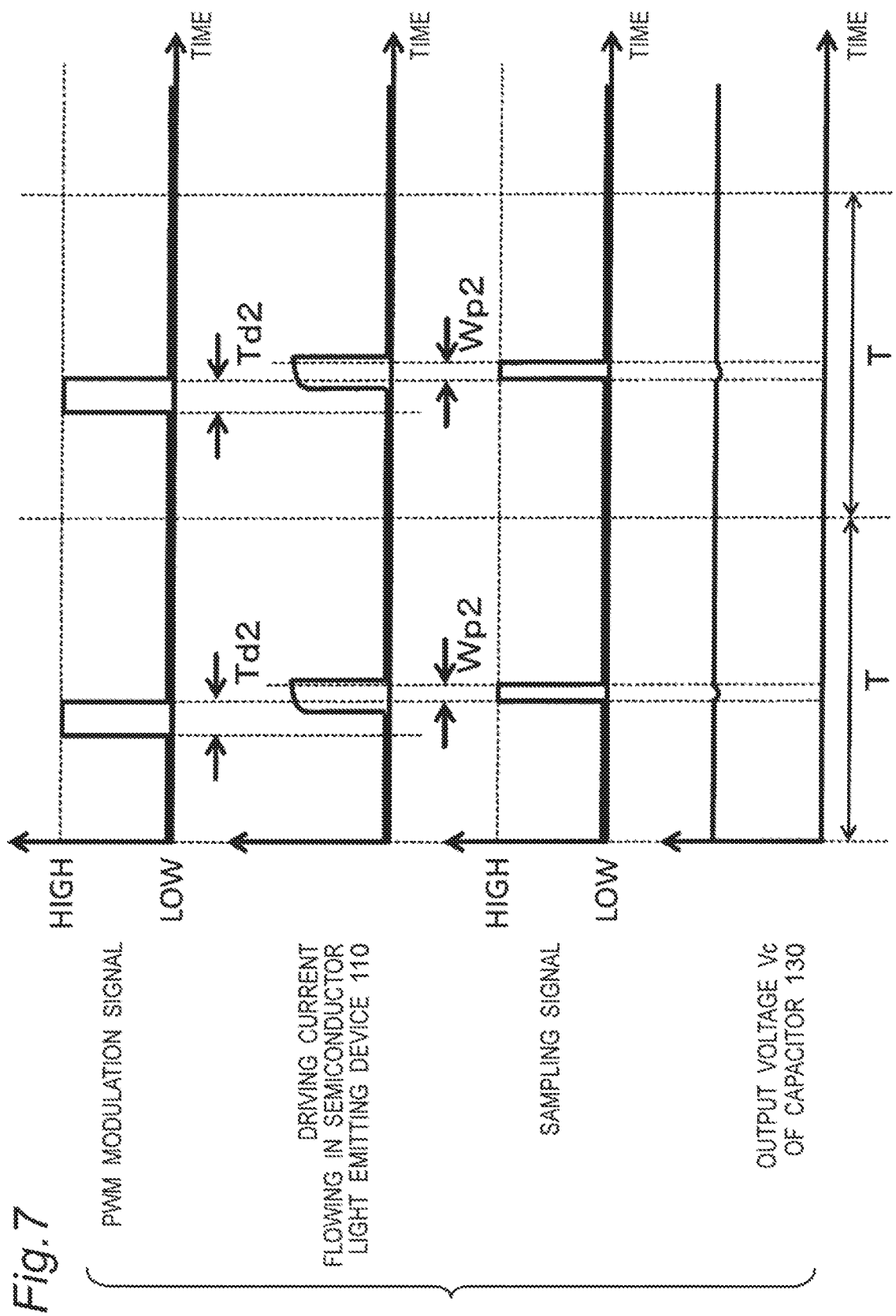
FIG. 7 is a timing chart showing an example of changes in signals etc. in the semiconductor tight-emitting device driving apparatus 3 of FIG. 6.

FIG. 7 is a timing chart showing an example of changes in the signals etc. in the semiconductor light-emitting device driving apparatus 3 of FIG. 6. As shown in FIG. 7, the delay time Td2 in the sampling signal generator circuit 180A is set larger than the delay time Td1 in the sampling signal generator circuit 180. Further, the pulse width Wp2 of the sampling signal is adjusted to be narrower than the pulse width Wp1 of the sampling signal in the first embodiment. This allows exclusive sampling of a part of the interval when a current actually flows in a semiconductor light-emitting device 110.

The delay time Td2 and the pulse width Wp2 are adjusted such that a sampling interval does not include a rising interval immediately after a current starts to flow to the semiconductor light-emitting device 110 and the interval immediately before the current becomes off. This eliminates sampling of a detection voltage during the interval when the current does not flows in the semiconductor light-emitting device 110, even if the delay time of the current flowing in the semiconductor light-emitting device 110 with respect to a PWM modulation signal slightly changes. In addition, even if the rising speed of the current flowing in the semiconductor light-emitting device 110 increases or decreases to an extent, the detection voltage is sampled only during the interval when there is no great impact. Therefore, it is possible to further suppress influence of the temperature of the semiconductor light-emitting device 110 or variation and the like of element characteristics, and to supply a more stable driving current.

Fourth Embodiment

Figure 8:
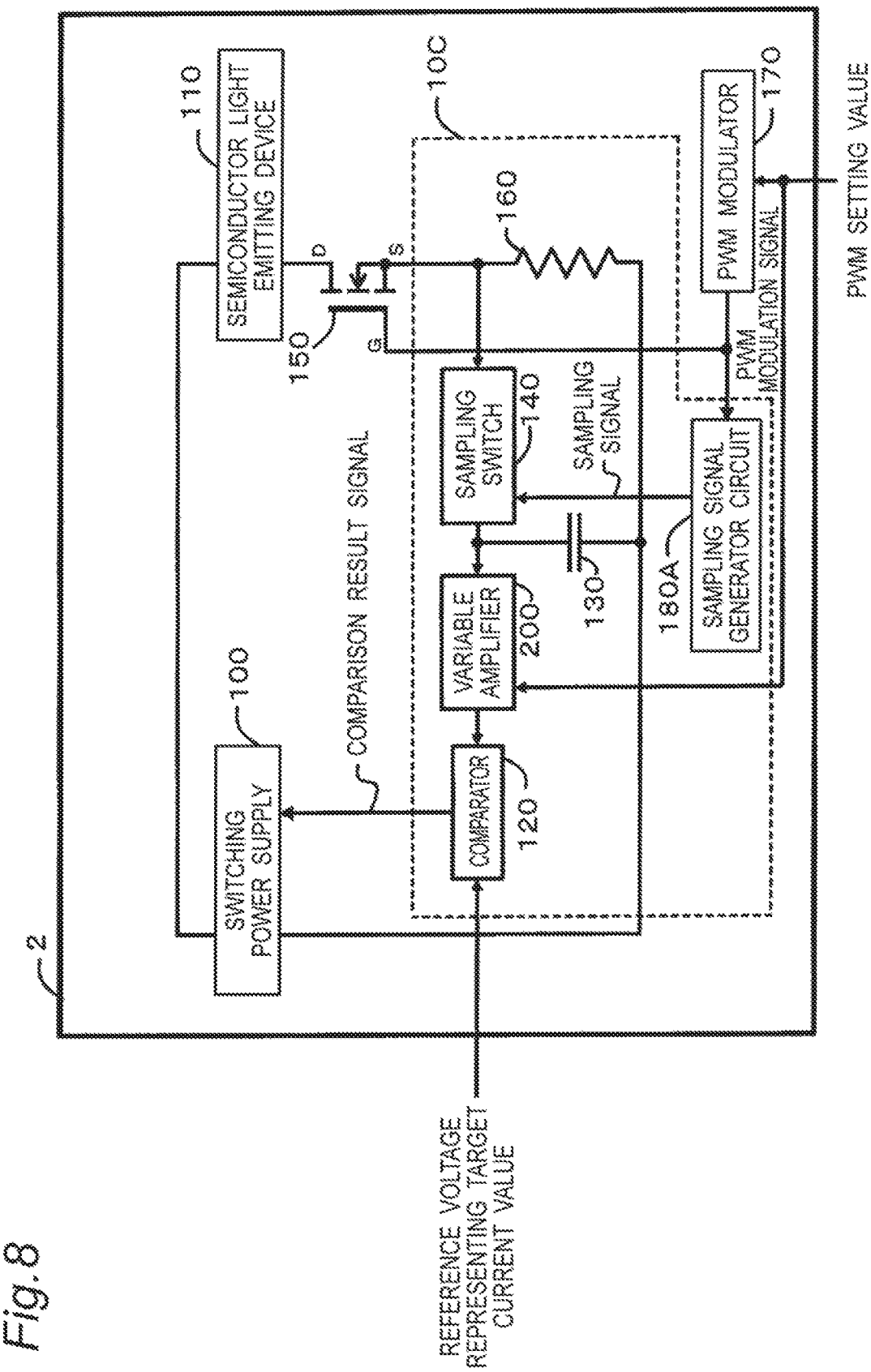
FIG. 8 is a block diagram showing a configuration example of a semiconductor light-emitting device driving apparatus 4 according to a fourth embodiment.

FIG. 8 is a block diagram showing a configuration example of a semiconductor light-emitting device driving apparatus 4 according to a fourth embodiment. As compared with the semiconductor light-emitting device driving apparatus 1 of FIG. 1, in the semiconductor light-emitting device driving apparatus 4, the feedback circuit 10 is replaced with a feedback circuit 10C. As compared with the feedback circuit 10, the feedback circuit 10C further includes the variable amplifier 200 according to the second embodiment, and the sampling signal generator circuit 180 is replaced with the sampling signal generator circuit 180A in the third embodiment. Thus, some or all of the features shown in the embodiments of the present disclosure can be also combined with each other to exhibit combined effects.

Other Embodiments

As described above, the first to fourth embodiments are described as an example of the technique disclosed in the present application. However, the technique in the present disclosure is not limited to these, and can be also applied to embodiments in which change, replacement, addition, omission, and the like are made as appropriate. In addition, it is also possible to combine each constituent element described in the first to fourth embodiments above, to provide a new embodiment. Accordingly, the other embodiments will be exemplified below.

In the first to fourth embodiments, a case where an N-channel MOSFET is used is described as an example of means for controlling the driving current to be turned on and off, where the driving current flows in the semiconductor light-emitting device 110. The means for controlling the driving current to be turned on and off is not limited to the N-channel MOSFET. For example, a P-channel MOSFET may be used as the means for controlling the driving current to be turned on an off. However, since the N-channel MOSFET operating as the means for controlling the driving current to be turned on and off has high speed and low resistance, using this can suppress the energy loss.

As described above, the embodiments are described as examples of the technique in the present disclosure. For this purpose, the accompanying drawings and the detailed description are provided.

Accordingly, some of the constituent elements described in the accompanying drawings and the detailed description may also include constituent elements that are not indispensable for solving the problem, in addition to constituent elements that are indispensable for solving the problem. Therefore, these constituent elements that are not indispensable should not be immediately recognized to be indispensable on the basis of the fact that these constituent elements that are not indispensable are described in the accompanying drawings or the detailed description.

In addition, since the above-described embodiments are intended to exemplify the technique in the present disclosure, it is possible to make various changes, replacements, additions, or omissions within the scope of claims, the equivalent thereof, or the like.

A semiconductor light-emitting device driving apparatus according to the present disclosure can be used, for example, for a lighting apparatus, a projection video display apparatus, and the like using a semiconductor light-emitting device driving apparatus for adjusting the luminance of a semiconductor light-emitting device by PWM modulation.

What is claimed is:

1. A semiconductor light-emitting device driving apparatus comprising:
   a semiconductor light-emitting device;
   a switching power supply that outputs a driving current for driving the semiconductor light-emitting device;
   a switching element that controls the driving current to be turned on and off;
   a PWM modulator that generates a PWM modulation signal for controlling the switching element to be turned on and off based on a PWM setting value inputted from outside; and
   a feedback circuit that drives and controls the switching power supply based on the driving current and a target current value that is externally inputted, wherein the feedback circuit drives and controls the switching power supply such that an average value of the driving current for an interval when the driving current flows is equal to the target current value, and wherein the feedback circuit comprises:
- a detection resistor that generates a detection voltage by the driving current
- a capacitor that time-averages the detection voltage, and generates an output voltage; and
- a comparator that drives and controls the switching power supply based on a comparison result signal generated by comparing an output voltage of the capacitor with a reference voltage indicating the target current value.

2. The semiconductor light-emitting device driving apparatus as claimed in claim 1, wherein the feedback circuit further comprises:
- a sampling switch that turns on and off a connection between the detection resistor and the capacitor; and
- a sampling signal generator circuit that generates a sampling signal based on the PWM modulation signal, and wherein the sampling signal generator circuit generates the sampling signal by delaying the PWM modulation signal by a predetermined time such that the sampling signal is turned on during an interval when the driving current actually flows.

3. The semiconductor light-emitting device driving apparatus as claimed in claim 2, wherein the sampling signal generator circuit further adjusts a pulse width of the sampling signal to be generated to be narrower than a pulse width of the PWM modulation signal that is inputted.

4. The semiconductor light-emitting device driving apparatus as claimed in claim 1, wherein the feedback circuit further comprises a variable amplifier configured to amplify an output voltage of the capacitor to be inputted to the comparator, wherein the variable amplifier amplifies the output voltage of the capacitor when the PWM setting value is smaller than a predetermined value, and wherein an amplification factor of the variable amplifier is larger as the PWM setting value is smaller.

* * * * *